United States Patent [19]
Matsumoto et al.

[11] Patent Number: 5,880,503
[45] Date of Patent: *Mar. 9, 1999

[54] SEMICONDUCTOR INTEGRATED CIRCUIT DEVICE HAVING STATIC MEMORY CELL WITH CMOS STRUCTURE

[75] Inventors: Hisashi Matsumoto; Takio Ohno, both of Tokyo, Japan

[73] Assignee: Mitsubishi Denki Kabushiki Kaisha, Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 791,619

[22] Filed: Jan. 31, 1997

[30] Foreign Application Priority Data

Aug. 7, 1996 [JP] Japan ................................. 8-208416

[51] Int. Cl.$^6$ ............................. H01L 29/76; H01L 29/94
[52] U.S. Cl. ....................... 257/372; 257/369; 257/377; 257/903
[58] Field of Search .................................. 257/369, 372, 257/377, 903

[56] References Cited

U.S. PATENT DOCUMENTS 4,905,073 2/1990 Chen et al. .
5,521,572 5/1996 Ohkubo .................................. 365/154
5,654,572 8/1997 Kawase ................................... 257/371

FOREIGN PATENT DOCUMENTS 59-163856 9/1984 Japan .
1-44023 9/1989 Japan .

*Primary Examiner*—Valencia Martin-Wallace
*Attorney, Agent, or Firm*—Oblon, Spivak, McClelland, Maier & Neustadt, P.C.

[57] ABSTRACT

A titanium silicide (4) covers surfaces of P$^+$-type diffusion region (7) and N$^+$-type diffusion region (8) to electrically connect the diffusion regions (7, 8) through the titanium silicide (4), and a surface of the titanium silicide (4) is covered with an insulation film (10). A power supply potential applied to a metal wire (2) is thereby applied to an N$^+$-type diffusion region (6), an N well (12) and the N$^+$-type diffusion region (8) through a contact hole (3) and further supplied for the P$^+$-type diffusion region (7) serving as a source region of PMOS transistor through the titanium silicide (4). That eliminates the need for providing any contact for supplying the diffusion regions 7 and 8 with the power supply potential to attain reduction in layout size, while preventing a latch-up. Thus, the N well-source structure of a semiconductor integrated circuit device including an SRAM with Full CMOS structure eliminates the need for providing a contact on the surfaces of the P$^+$-type diffusion region and the N$^+$-type diffusion region, to attain reduction in layout size.

8 Claims, 9 Drawing Sheets

1 (STATIC MEMORY CELL)

F I G. 8
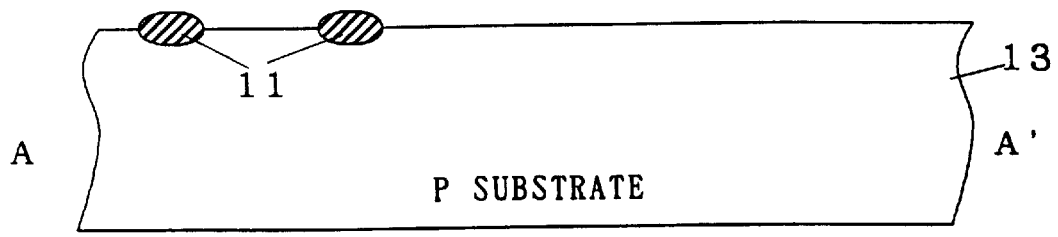
F I G. 9
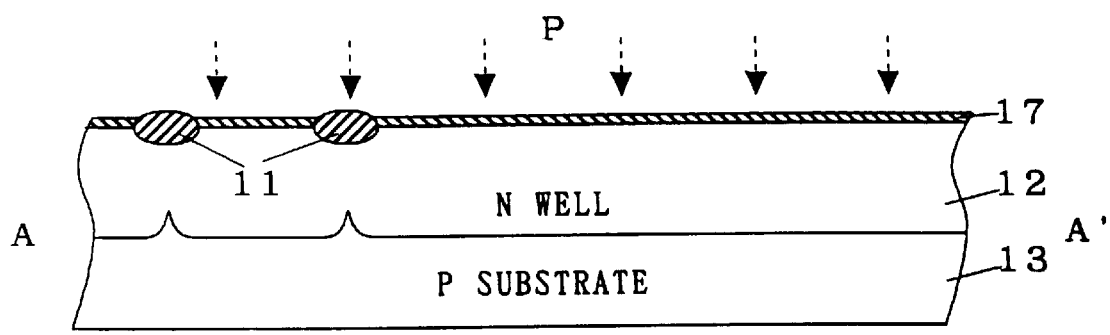
F I G. 10
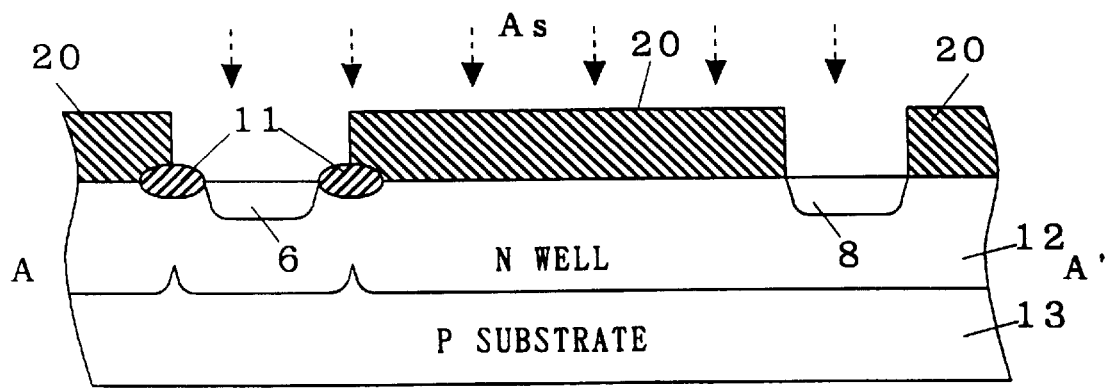

SEMICONDUCTOR INTEGRATED CIRCUIT DEVICE HAVING STATIC MEMORY CELL WITH CMOS STRUCTURE

BACKGROUND OF THE INVENTION

1. Field of the Invention

The present invention relates to a semiconductor integrated circuit device, and more particularly to an interconnection in a complementary static RAM and the like and a method of manufacturing a static memory cell.

2. Description of the Background Art

FIGS. 18 and 19 show an example of N-type well-source structure in a memory cell of a prior-art Full CMOS SRAM, for example, as disclosed in Japanese Patent Publication 1-44023. FIG. 18 is a schematic plan view illustrating a pattern wiring of a memory cell in such an SRAM, and FIG. 19 is a cross section of FIG. 18 along the line C–C'.

In FIGS. 18 and 19, a one-bit memory cell 1P of a static RAM, metal wires (1AL) 2P and 14P for making a contact, contact holes 3P, 15P, 22 and 23, a GND wiring layer 5P to which a ground potential is applied, $N^+$-type diffusion regions 6P and 8P, $P^+$-type diffusion regions 7P and 9P, a silicon oxide film 10P serving as an insulation film, an insulator 11P for electrically isolating the diffusion regions 6p and 7P and the like, an N-type well 12P to form a PMOS region and a P-type substrate 13P are shown.

Referring to FIG. 19, a path for supplying the static memory cell 1P with a power supply potential ($V_{DD}$) will be described. When the power supply potential $V_{DD}$ is applied to the metal wire 2P by an external wire not shown to which the power supply potential is applied, the power supply potential $V_{DD}$ is applied to the N well 12P from the metal wire 2P through the contact hole 3P and the $N^+$-type diffusion region 6P, and further applied to the $P^+$-type diffusion region 7P serving as a source region of PMOS transistor from the N well 12P through the $N^+$-type diffusion region 8P, the contact hole 22, the metal wire 14P and the contact hole 15P.

The N-type well-source structure is effective for improvement in withstand latch-up voltage, as already recited in the Japanese Patent Publication 1-44023. Specifically discussing, an emitter potential of a PNP transistor consisting of the P-type substrate 13P, the N well 12P and the $P^+$-type diffusion region 7P, which is supplied through the N well 12P, the $N^+$-type diffusion region 8P, the contact hole 22 and the metal wire 14P, is necessarily lower than a base potential of the PNP transistor which is the same as the potential at the N well 12P. Therefore, no forward bias is applied between the emitter and base of PNP transistor, and accordingly a latch-up can be prevented.

The prior-art Full CMOS SRAM with the above structure can prevent a latch-up, but raises the following problem. Specifically, as shown in the prior art of FIGS. 18 and 19, the $N^+$-type diffusion region 8P and the $P^+$-type diffusion region 7P form a PN junction and are not electrically connected. To supply the source region of PMOS transistor in the N well 12P with a source potential, the two diffusion regions 7P and 8P need to be electrically connected by providing the contact hole 22, the metal wire 14P and the contact hole 15P on the way of the supply path. Provision of such interconnection region disadvantageously results in enlargement of the layout size.

For example, sizes L1 and L2 shown in FIG. 19 have to be set depending on diameters of the contact holes 22 and 15P, respectively. To arrange the contact holes 22 and 15P with relatively low accuracy for manufacturing simplicity, the sizes L1 and L2 need to be set sufficiently larger than the diameters of the contact holes 22 and 15P, respectively. As shown in FIG. 18, also in a direction of Y, the width W of the diffusion regions 7P and 8P need to be set sufficiently larger than the diameters of the contact holes 15P and 22, for manufacturing convenience. Therefore, the surface area of the $N^+$-type diffusion region 8P and the like must be inevitably larger.

The problem as above rises not only in a case of N well-source structure shown in FIGS. 18 and 19 but also in a case of ground interconnection of memory cells of Full CMOS SRAM with P-type well-source structure.

Accordingly, provision of well-source structure in SRAM memory cells with Full CMOS structure, generally, ensures improvement in withstand latch-up voltage, but on the other hand, disadvantageously increases the layout size of the diffusion regions to form a well-source structure.

SUMMARY OF THE INVENTION

The present invention is directed to a semiconductor integrated circuit device having a static memory cell with CMOS structure. According to a first aspect of the present invention, the semiconductor integrated circuit device comprises: a substrate of a first conductivity type; a well of a second conductivity type provided extending inwardly from a surface of the substrate and electrically isolated from the substrate; a first diffusion region of the second conductivity type provided in a first portion on a surface of and an inside of the well and externally given a predetermined potential; a second diffusion region of the second conductivity type provided in a second portion on the surface of and the inside of the well; a third diffusion region of the first conductivity type provided in a third portion on the surface of and the inside of the well so as to be electrically isolated from the well and the first and second diffusion regions; a metal-semiconductor compound film provided on surfaces of the second and third diffusion regions, for electrically connecting the second and third diffusion regions; and an insulation film provided entirely on a surface of the metal-semiconductor compound film.

Although the predetermined potential applied to the first diffusion region is supplied for the well, the potential is not propagated to the substrate since the well is electrically isolated from the substrate. The potential applied to the well is supplied for the second diffusion region of the same conductivity type. Since the metal-semiconductor compound film covers the surfaces of the second and third diffusion regions, the two diffusion regions are electrically connected to each other. Accordingly, the potential applied to the second diffusion region is supplied for the third diffusion region through the metal-semiconductor compound film. With this potential supply path, the potential practically applied to the well is higher than the potential practically applied to the third diffusion region, and therefore the floating transistor element consisting the substrate, the well and the third diffusion region becomes nonconducted, to thereby improve the withstand latch-up voltage. Moreover, the metal-semiconductor compound film directly conduct the second and third diffusion regions, performing the same function as the metal wiring layer for making a contact provided inside the contact hole. For this reason, the surface of the metal-semiconductor compound film is directly and entirely covered with the insulation film. This structure fundamentally eliminates the need for forming a contact hole on the surfaces of the second and third diffusion regions, and accordingly the surface areas of the second and third diffusion regions can be set without reference to the diameter of the contact hole. As the result, the layout size of each memory cell in a Full CMOS structure can be considerably reduced.

According to a second aspect of the present invention, in the semiconductor integrated circuit device of the first aspect, the second portion and the third portion are provided adjacently to each other.

According to a third aspect of the present invention, in the semiconductor integrated circuit device of the first and second aspects, the third portion is provided between the first and second portions.

According to a fourth aspect of the present invention, a semiconductor integrated circuit device having a static memory cell with CMOS structure comprises: an underlying layer of a first conductivity type; a well of a second conductivity type provided on a surface of and an inside of the underlying layer, electrically isolated from the underlying layer and given a predetermined potential; a first diffusion region of the first conductivity type provided on a surface of and an inside of the well; a second diffusion region of the second conductivity type provided on the surface of and the inside of the well; a conductor film covering surfaces of the first and second diffusion regions and electrically and directly connecting the first and second diffusion regions; and an insulation film covering entirely on a surface of the conductor film.

The conductor film electrically and directly connects the first diffusion region and the second diffusion region which form a PN junction. Accordingly, the potential at the well is supplied for the second diffusion region through the first diffusion region and the conductor film. With such a supply path, the relation (the potential at the well)>(the potential at the second diffusion region) holds and a transistor element consisting of the underlying layer, the well and the second diffusion region becomes nonconducted, to thereby more effectively prevent the latch-up. Moreover, in setting the surface areas of the first and second diffusion regions, no limitation is imposed on reduction of the surface areas depending on the diameter of the contact hole since the conductor film is directly and entirely covered with the insulation film. Therefore, the layout size of the first and second diffusion regions is markedly reduced as compared with the prior art.

The present invention is also directed to a method of manufacturing a semiconductor integrated circuit device having a static memory cell with CMOS structure. According to a fifth aspect of the present invention, the method comprises steps of: preparing an underlying layer of a first conductivity type; forming a well of a second conductivity type which is electrically isolated from the underlying layer on a surface of and an inside of the underlying layer; forming a first diffusion region of the second conductivity type which is externally given a predetermined potential, a second diffusion region of the second conductivity type and a third diffusion region of the first conductivity type in a first, second and third portions, respectively, on a surface of and an inside of the well; and laminating in sequence a conductor film of metal-semiconductor compound and an insulation film on surfaces of the second and third diffusion regions.

In the step of laminating the films, the conductor film made of metal-semiconductor compound is formed directly on the surfaces of the second and third diffusion regions, to electrically and directly connect the second and third diffusion regions. Accordingly, this step eliminates a process of forming a contact hole on the surfaces of the second and third diffusion regions and forming a metal wiring layer for a making a contact inside the hole, thus simplifying the manufacturing process. The function of this step has an important effect on the preceding step of forming the first, second and third diffusion regions. Specifically, in the step of forming the diffusion regions, the second and third diffusion regions can be formed without any consideration of formation of the contact hole and the like required in the prior art. That allows determination of the sizes of the second and third diffusion regions without any limitation on size-reduction depending on the diameter of the contact hole, and therefore it is possible to markedly reduce the layout size of the second and third diffusion regions as compared with the prior art.

Thus, the memory cell with Full CMOS structure in which the layout size is reduced and the withstand latch-up voltage is improved can be practically manufactured through a simple process.

According to a sixth aspect of the present invention, in the method of the fifth aspect, the step of laminating the conductor film and the insulation film includes steps of forming the conductor film so as to directly cover the surfaces of the second and third diffusion regions, and forming the insulation film so as to directly and entirely cover a surface of the conductor film.

In the semiconductor integrated circuit device of the first to third aspects, the second diffusion region of the second conductivity type and the third diffusion region of the first conductivity type are electrically connected through the metal-semiconductor compound film and the metal-semiconductor compound film is covered with only the insulation film. Accordingly the predetermined potential applied to the first diffusion region can be applied to the third diffusion region through the well of the second conductivity type without forming any contact hole on both or either of the second and third diffusion regions. Therefore, In the memory cell with Full CMOS structure, the layout size of the second and third diffusion regions can be markedly reduced while using the well-source structure like the prior art.

In the semiconductor integrated circuit device of the second aspect, particularly, the second and third diffusion regions are so formed as to be adjacent to each other, and accordingly the layout size can be further reduced as compared with that of the first aspect.

In the semiconductor integrated circuit device of the third aspect, the third diffusion region is formed between the first and second diffusion regions, and accordingly the layout size can be reduced while effectively preventing the latch-up.

In the semiconductor integrated circuit device of the fourth aspect, no limitation is imposed on size-reduction depending on the diameter of the contact hole unlike the prior art, and accordingly the layout size of the first and second diffusion regions can be reduced as compared with the prior art.

In the method of manufacturing the semiconductor integrated circuit device of the fifth and sixth aspects, the step of laminating the films eliminates the process of forming the contact hole and forming the metal wiring layer for making a contact inside the contact hole and the second and third diffusion regions can be formed without any consideration of forming the contact hole in the step of forming the diffusion regions. As the result, the present invention produces effects of simplifying the manufacturing process and markedly reducing the layout size of the second and third diffusion regions.

An object of the present invention is to provide a semiconductor integrated circuit device which eliminates the need for providing a contact hole on the surfaces of the second diffusion region and the third diffusion region to reduce the layout size of the diffusion regions, while preventing the latch-up with the well-source structure, and to provide a method of manufacturing the semiconductor integrated circuit device.

These and other objects, features, aspects and advantages of the present invention will become more apparent from the following detailed description of the present invention when taken in conjunction with the accompanying drawings.

BRIEF DESCRIPTION OF THE DRAWINGS

FIGS. 6 to 17 are cross sections illustrating a manufacturing process of the semiconductor integrated circuit device in accordance with the first preferred embodiment of the present invention;

DESCRIPTION OF THE PREFERRED EMBODIMENTS

The First Preferred Embodiment.

A semiconductor integrated circuit device in accordance with the first preferred embodiment of the present invention will be discussed below with reference to figures.

Figure 1:
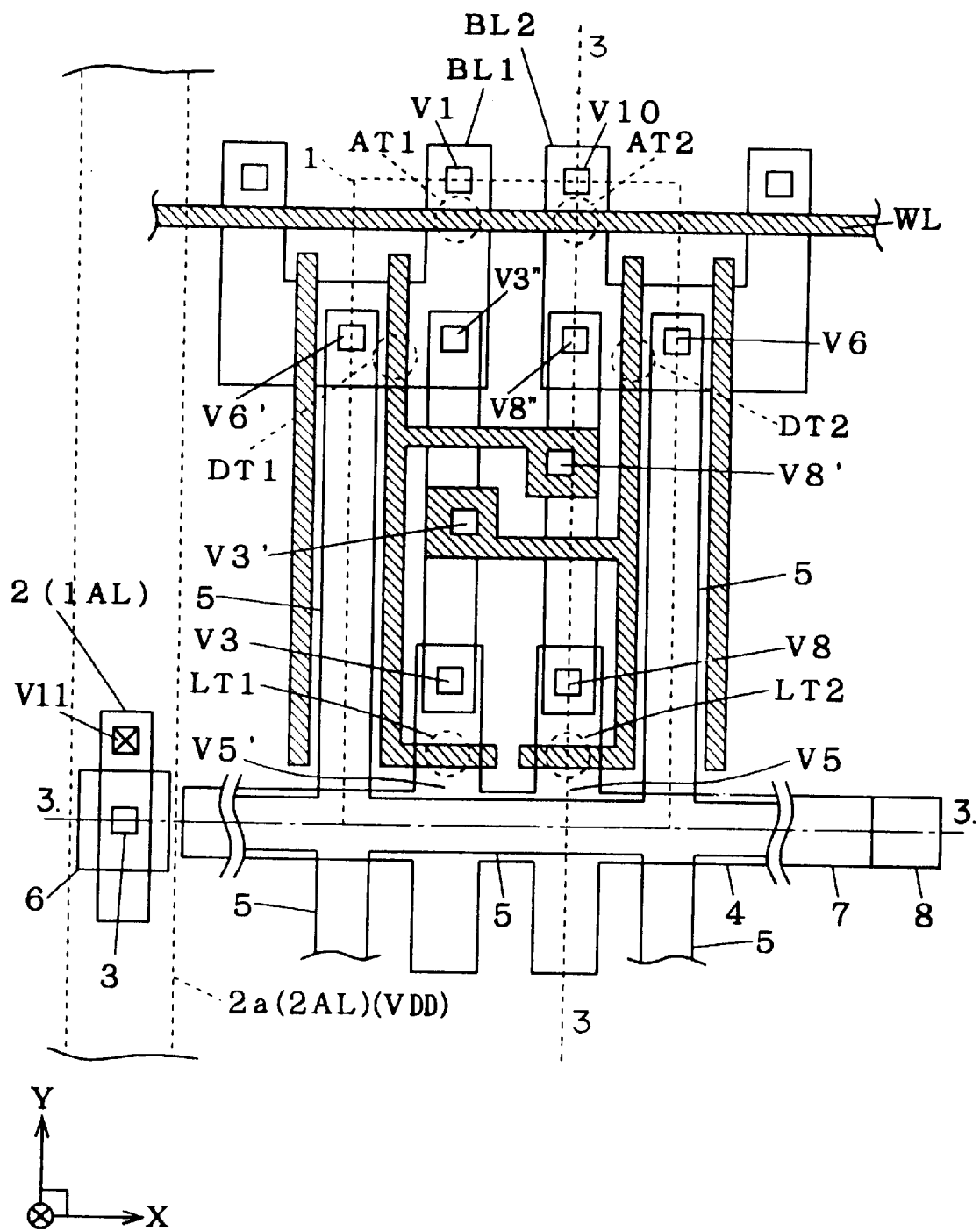
FIG. 1 is a schematic plan view showing a pattern wiring of a semiconductor integrated circuit device in accordance with a first preferred embodiment of the present invention.
Figure 2:
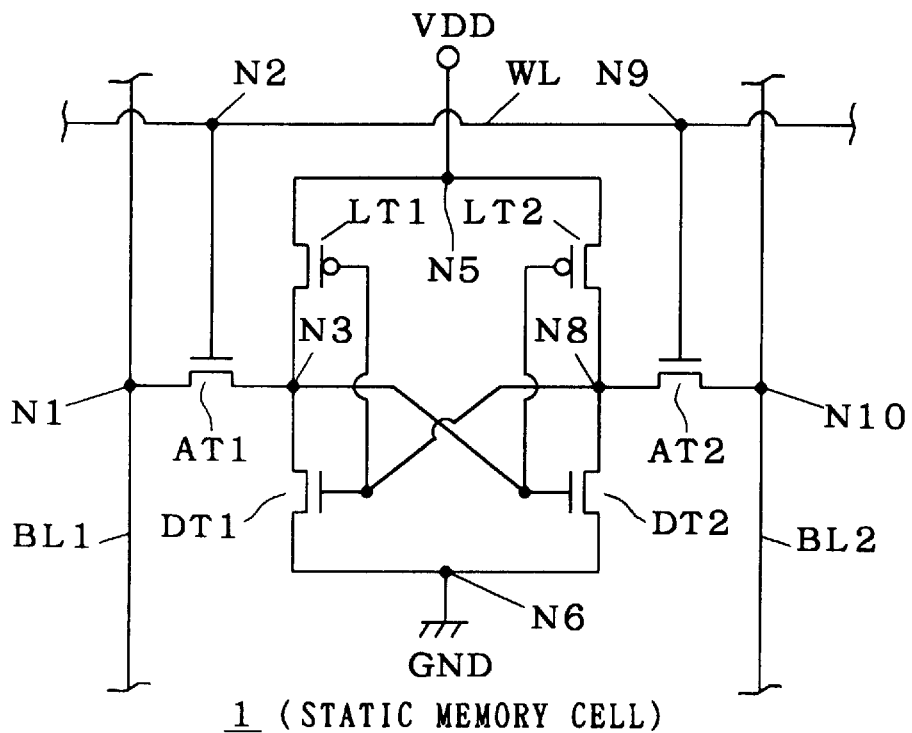
FIG. 2 is an equivalent circuit diagram of a one-bit memory cell in the semiconductor integrated circuit device of FIG. 1.
Figure 3:
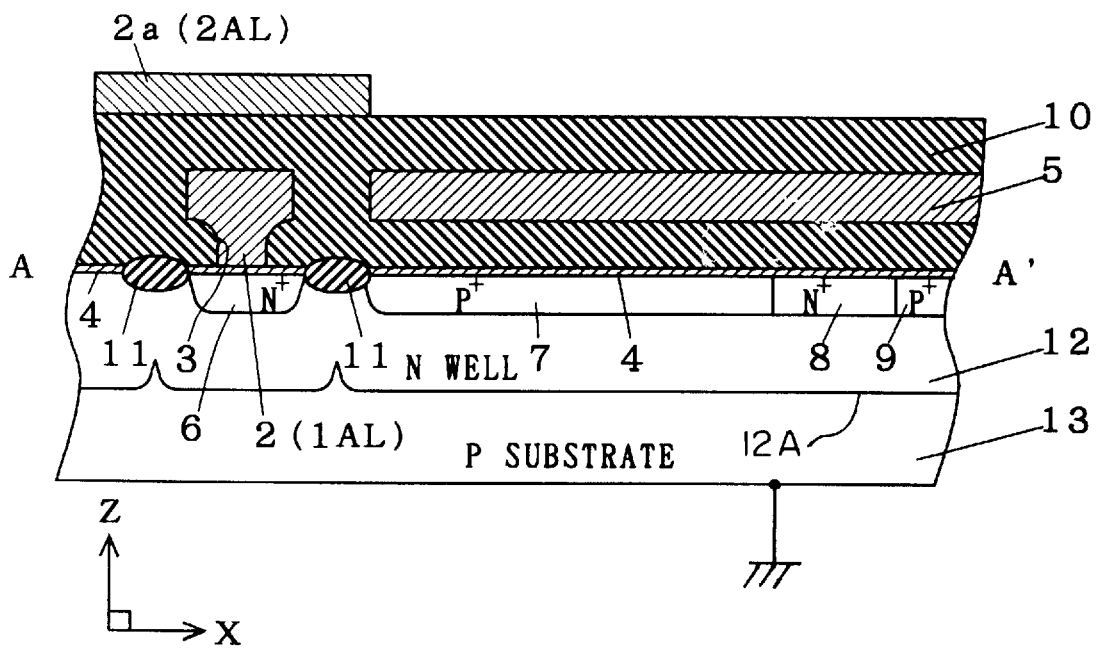
FIG. 3 is a cross section of FIG. 1 along the line A–A' showing the semiconductor integrated circuit device in accordance with the first preferred embodiment of the present invention.
Figure 4:
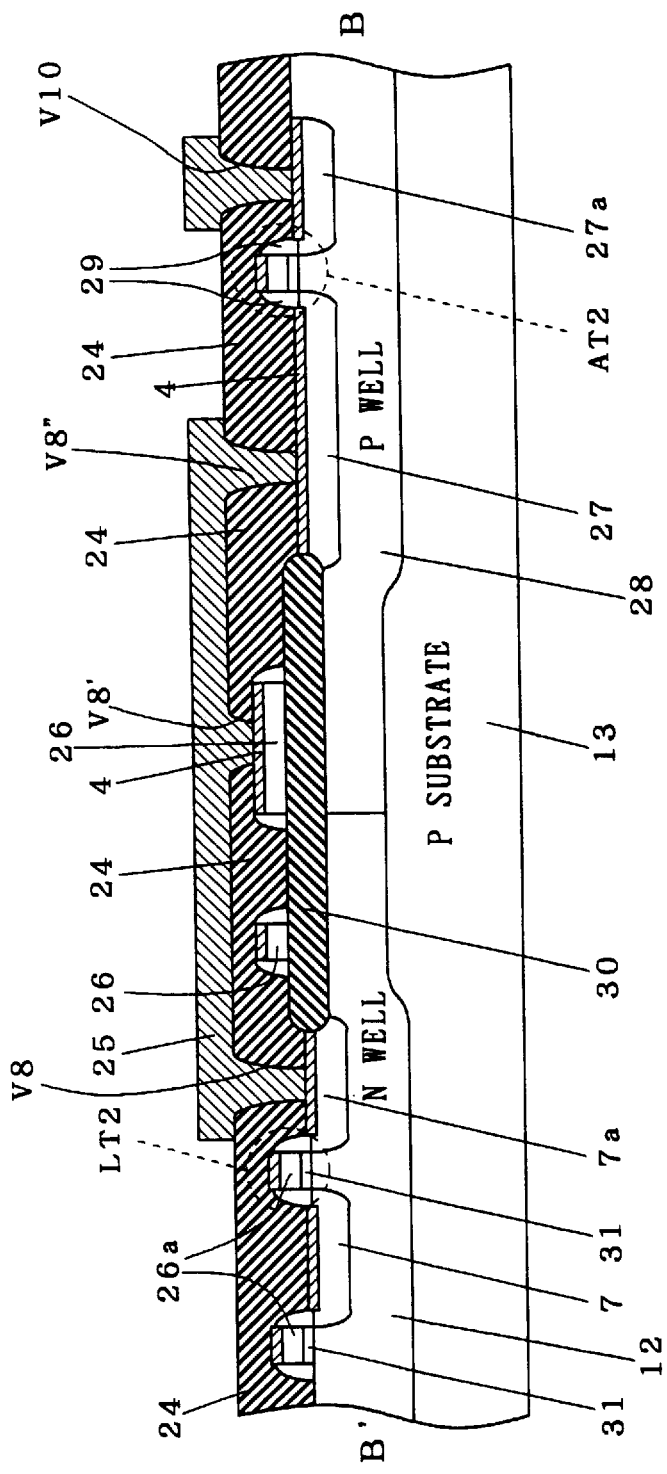
FIG. 4 is a cross section of FIG. 1 along the line B–B' showing the semiconductor integrated circuit device in accordance with the first preferred embodiment of the present invention.

FIG. 1 is a schematic plan view of a one-bit memory cell, showing a pattern wiring of the semiconductor integrated circuit device having a memory cell array of SRAM (Static Random Access Memory) with Full CMOS structure. In this figure, for convenience, an insulation film and the like are omitted. FIG. 2 is an equivalent circuit diagram of a one-bit memory cell 1 shown in FIG. 1. FIGS. 3 and 4 are cross sections of FIG. 1 along the lines A–A' and B–B', respectively.

As shown in FIGS. 1 and 3, a metal wiring layer 2a (2AL: a second metal wiring layer) to which a power supply potential $V_{DD}$ (a predetermined potential) is externally applied is provided along the direction of Y-axis, and is electrically connected to a metal wiring layer 2 (1AL: a first metal wiring layer) which is formed in a lower layer along the direction of Y-axis through a via hole V11 provided in an insulation film 10. The metal wiring layer 2 is electrically connected to an N$^+$-type diffusion region 6 (the second diffusion region of the second conductivity type) discussed later through a contact hole 3 provided in the insulation film 10 and a metal-semiconductor compound film 4 (the conductor film). The film 4 serving as a bottom surface of the contact hole 3 is not always needed.

The memory cell 1 of FIG. 1 is a six-element type memory cell, as shown in FIG. 2, and the contact holes V1, (V3, V3', V3"), (V6, V6'), (V8, V8', V8") and P$^+$-type diffusion region (V5, V5') correspond to nodes N1, N3, N6, N8 and N5, respectively, of FIG. 2. In FIGS. 1 and 2, a word line WL, bit lines BL1 and BL2, access transistors AT1 and AT2, driver transistors DT1 and DT2 and load transistors LT1 and LT2 are shown. Naturally, the static memory cell 1 may lbe a four-element type memory cell, instead of six-element type memory cell, and specifically, both the load transistors LT1 and LT2 may be replaced by resistance elements.

As shown in FIGS. 3 and 4, on a surface (main surface) of and an inside of a P-type substrate 13 (the substrate of the first conductivity type) serving as an underlying layer, an N-type well 12 (the well of the second conductivity type) which is electrically isolated from the P-type substrate 13 by isolation layer 12A is provided along the directions of X-axis and Y-axis. The N-type well 12 may be formed inwardly from a surface of the substrate 13. Further, on a surface of and an inside of the N well 12, the N$^+$-type diffusion region 6, as discussed earlier, which is electrically connected to the metal wiring layer 2 is provided along the directions of X-axis and Y-axis. The region on the surface of and the inside of the N well 12 where the N$^+$-type diffusion region 6 is provided is referred to as the first region. A P$^+$-type diffusion region 7 (the third diffusion region of the first conductivity type or the second diffusion region of the second conductivity type) which is electrically isolated from the N$^+$-type diffusion region 6 and N-type well 12 with an insulation film 11 interposed therebetween is also provided along the directions of X-axis and Y-axis on the surface of and the inside of the N well 12, and the region where the P$^+$-type diffusion region 7 is provided is referred to as the third region. The P$^+$-type diffusion region 7 forms a source region of both the load transistors LT1 and LT2 in the static memory cell 1, as shown in FIG. 4. An N$^+$-type diffusion region 8 (the second diffusion region of the second conductivity type or the first diffusion region of the first conductivity type) is provided on the surface of and the inside of the N well 12 adjacently to the P$^+$-type diffusion region 7 forming a PN junction therewith, as described below and the region where the N$^+$-type diffusion region 8 is provided is referred to as the second region. Further, a P$^+$-type diffusion region 9 is provided adjacently to the N$^+$-type diffusion region 8, and the region where the P$^+$-type diffusion region 9 is provided is referred to as the fourth region. The P$^+$-type diffusion region 9 forms a source region of P-type MOS transistor (driver transistor) in another memory cell 1 adjacent to this memory cell 1 in the direction of X-axis.

A metal silicide film 4 (the metal-semiconductor compound film or the conductor film) is provided along the directions of X-axis and Y-axis so as to cover surfaces of the diffusion regions 7, 8 and 9. The metal silicide film 4 is made of, e.g., titanium silicide having a conductivity. Besides, cobalt silicide and nickel silicide may be used as the film 4. The metal silicide film 4 directly and electrically connects the P$^+$-type diffusion region 7 and the N$^+$-type diffusion region 8 which form a PN junction but are not electrically connected and connects the N⁺-type diffusion region 8 and the P⁺-type diffusion region 9 which also form a PN junction but are not electrically connected. The metal silicide film 4 has a thickness, e.g., approximately ranging from 100 to 1000 Å, depending on the width in the direction of Y.

The oxide film 10 (insulation film) made of e.g., $SiO_2$ film is provided so as to entirely and directly cover surfaces of the metal silicide 4 and the insulation film 11. Inside the insulation film 10, a GND wiring layer 5 is provided, which is electrically connected to an external ground through a contact hole.

On the other hand, the one-bit memory cell 1 is provided along the direction of Y-axis as shown in FIG. 4. Specifically, the N well 12 to form a PMOS region and a P-type well 28 (hereinafter referred to as P well) to form an NMOS region are provided on the surface of and the inside of the P-type substrate 13. Further, the P⁺-type diffusion regions 7 and 7a are provided on the surface of and the inside of the N well 12 and the metal silicide film 4 and the gate oxide film 31 are provided on the surface of the N well 12. A polysilicon film (gate) 26a and the metal silicide film 4 are provided on the gate oxide film 31, and side walls 29 are provided on the side surfaces of the films 31, 26a and 4. Furthermore, the metal silicide films 4 on the polysilicon film 26a and the P⁺-type diffusion region 7a are unintentionally produced in the process of manufacturing the metal silicide film 4 as discussed later, which are essentially irrelevant to the present invention and not always needed. N⁺-type diffusion regions 27 and 27a are formed on a surface (main surface) of and an inside of the P well 28 and further the metal silicide film 4 and the gate oxide film 31 are formed on the surface of P well 28. The polysilicon film (gate) 96a is formed on the film 31, and the metal silicide film 4 remains on a surface of the polysilicon film 26a. The side walls 29 are provided on the side surfaces of the films 31, 26a and 4 and the access transistor AT2 is thereby formed inside the P well 28. An insulation film 24 and a metal wiring layer 25 are formed in the upper layer. In the interface between the N well 12 and P well 28 and the vicinity, an insulator 30 is provided. The contact holes V8, V8' and V8" discussed earlier are provided in the insulation film 24.

Next, referring to FIG. 3, discussion will be presented as to a path for supplying the power supply potential $V_{DD}$ in the static memory cell 1.

Figure 18:
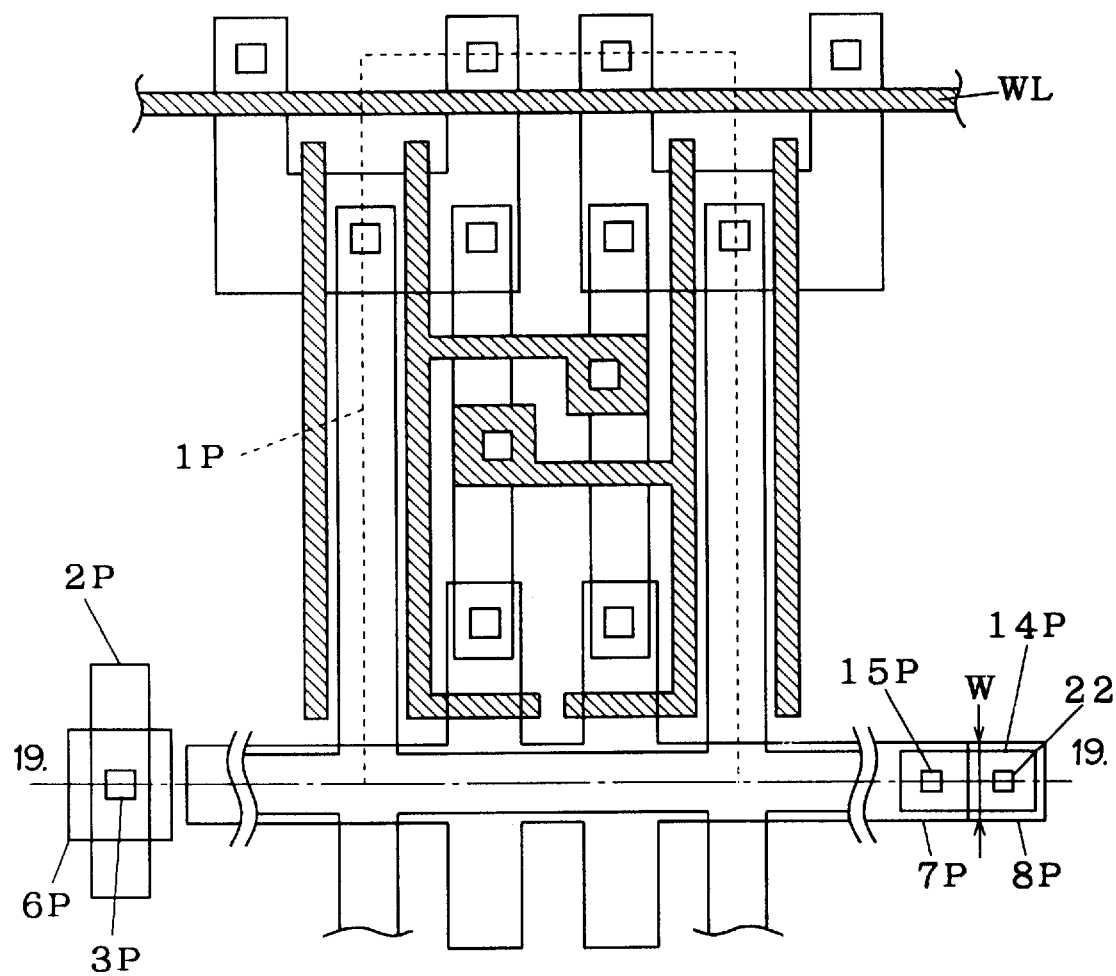
FIG. 18 is a schematic plan view showing a pattern wiring of a semiconductor integrated circuit device having an SRAM with Full CMOS structure in a prior art.
Figure 19:
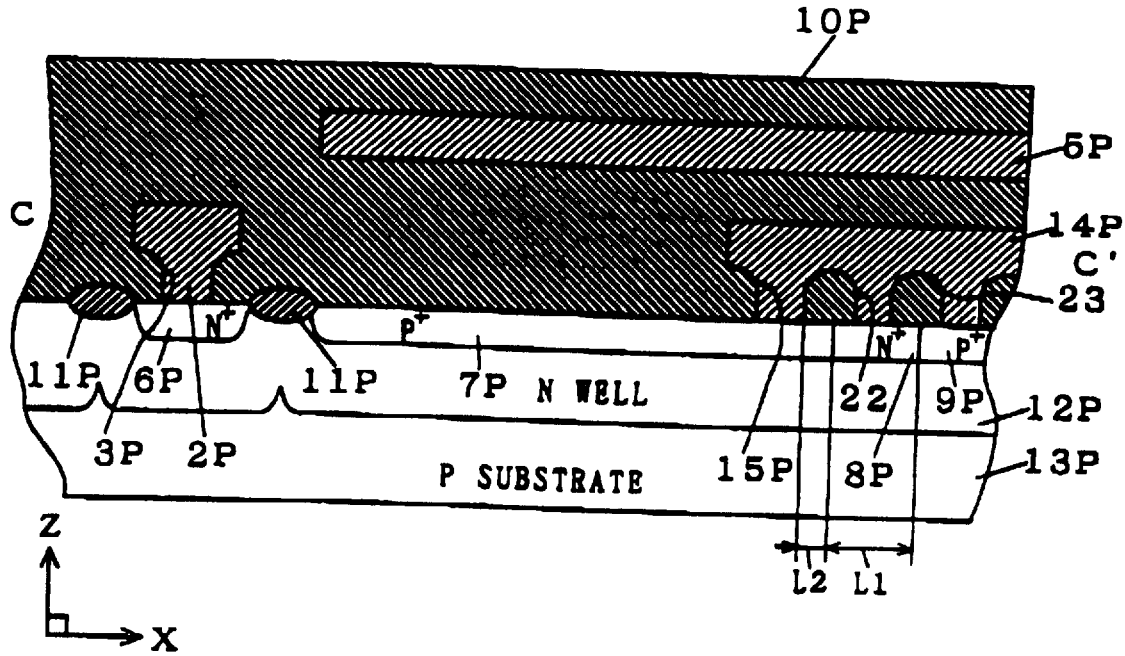
FIG. 19 is a cross section of FIG. 18 along the line C–C' showing the semiconductor integrated circuit device having the SRAM with Full CMOS structure in the prior art.
Figure 20:
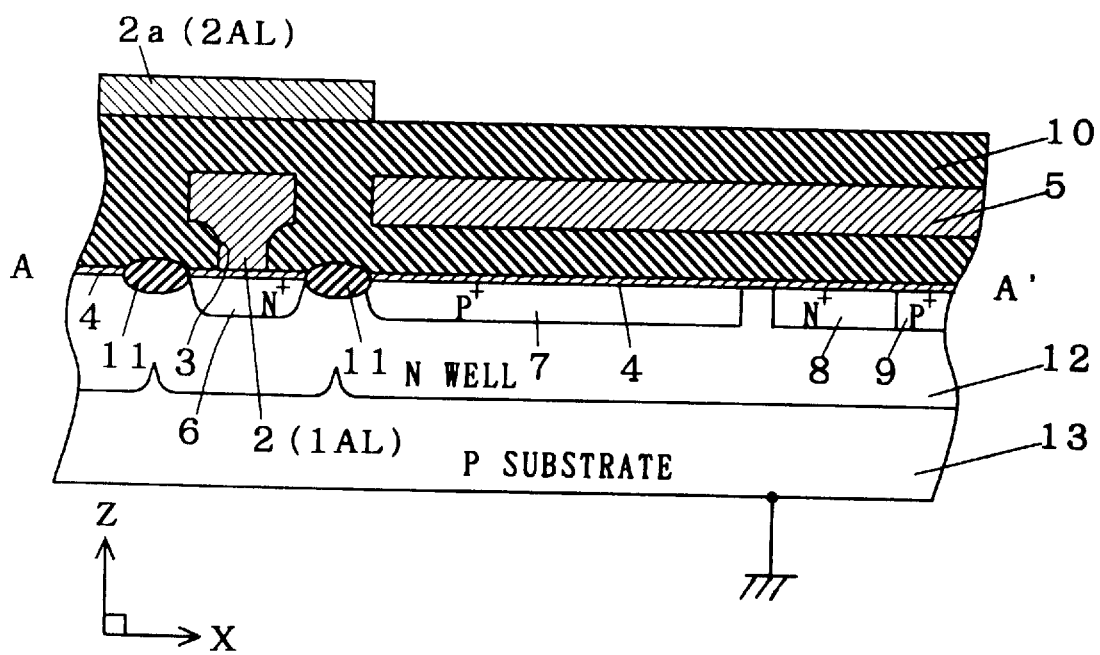
FIG. 20 is a cross section of a semiconductor integrated circuit device according to the present invention illustrating disconnection of semiconductor diffusion regions.

When the power supply potential $V_{DD}$ is externally applied to the metal wiring layer 2a (2AL), the power supply potential $V_{DD}$ is supplied for the metal wiring layer 2 (1AL) through the via hole V11 shown in FIG. 1 and further supplied for the N well 12 from the metal wiring layer 2 (1AL) through the contact hole 3, the metal silicide film 4 and the N⁺-type diffusion region 6. In this case, the N well 12 and the P-type substrate 13 are electrically isolated from each other. The power supply potential $V_{DD}$ applied to the N well 12 is further supplied for the P⁺-type diffusion region 7 (9) as the source region of PMOS transistor and the source electrode thereof through the N⁺-type diffusion region 8 and the metal silicide film 4. Therefore, in the static memory cell 1, with the N well-source structure for power supply interconnection, the relation (the potential at the N well 12)>(the potential at the P⁺-type diffusion region 7) holds and the withstand latch-up voltage is improved like in the prior art disclosed in the Japanese Patent Publication 1-44023. Moreover, in the static memory cell 1 of the present invention, the metal silicide film 4 directly covers the surfaces of the diffusion regions 7 and 8 to conduct the diffusion regions 7 and 8, and furthermore the surface of the metal silicide film 4 is entirely covered with the oxide film 10 which covers the metal wiring layer 2 (1AL), the GND wiring layer 5, the insulation film 11 and the like. This structure advantageously eliminates the need for the contacts (the metal wiring layer 2p and the contact holes 3P, 15P and 22 of FIG. 19) which have been essential in the prior art for electrical connection between the P⁺-type diffusion region 7P and the N⁺-type diffusion region 8P. Specifically, formation of the metal silicate film 4 allows electrical connection between the P⁺-type diffusion region 7 and the N⁺-type diffusion region 8, and the N well-source structure enables the supply of power supply potential for the source electrodes of PMOS transistors LT1 and LT2. This removes the limitation on the sizes L1, L2 and W as discussed earlier on the problem of the prior art with reference to FIGS. 18 and 19, and accordingly. the layout size of the diffusion regions 7 and 8 can be markedly reduced as compared with the prior art. According to the first preferred embodiment, for example the layout size can be reduced by about 10 to 20%.

The characteristic function and effect of the semiconductor integrated circuit device as discussed above results from the structure in which ① the metal silicide film 4 directly covers the diffusion regions 7 and 8 and ② the insulation film 10 directly and entirely covers the surface of the metal silicide film 4. In this point, a prior-art comparable in structure to the present invention, which is basically different from the present invention in being applied to a CMOS logic circuit (CMOS invertor), is disclosed in U.S. Pat. No. 4,905,073. An outline of the prior art disclosed in the document is as follows: Specifically, for example, considering case where an N-type diffusion layer and a P-type diffusion layer are formed on a surface of and an inside of an N well, the N-type diffusion layer is provided to supply the N well with a power supply potential applied thereto as a back gate potential, and the P-type diffusion region serves as a source region of P-channel MOS transistor. In the prior art, a silicide film is formed on surfaces of the diffusion regions and further a contact hole whose bottom surface is a portion of a surface of the silicide film is formed in an insulation film covering the silicide film. A metal wiring layer is formed inside the contact hole. An N-channel MODS transistor in a P-type well has like structure.

The technical concept of the prior art using the above structure lies in that a one-sided contact hole whose bottom surface is located above a surface of one diffusion layer (the P-type diffusion layer in the above case) serving as the source region of which a surface area is set larger than that of the other diffusion region (the N-type diffusion region) for supplying the back gate potential can be manufactured with a positioning accuracy lower than that of a common contact hole. The one-sided contact hole is obtained only by forming a suicide film of which one surface forms the bottom surface of the one-sided contact hole and the other surface covers the surfaces of the N-type and P-type diffusion regions. This prior art is based on the above technical concept.

Figure 5:
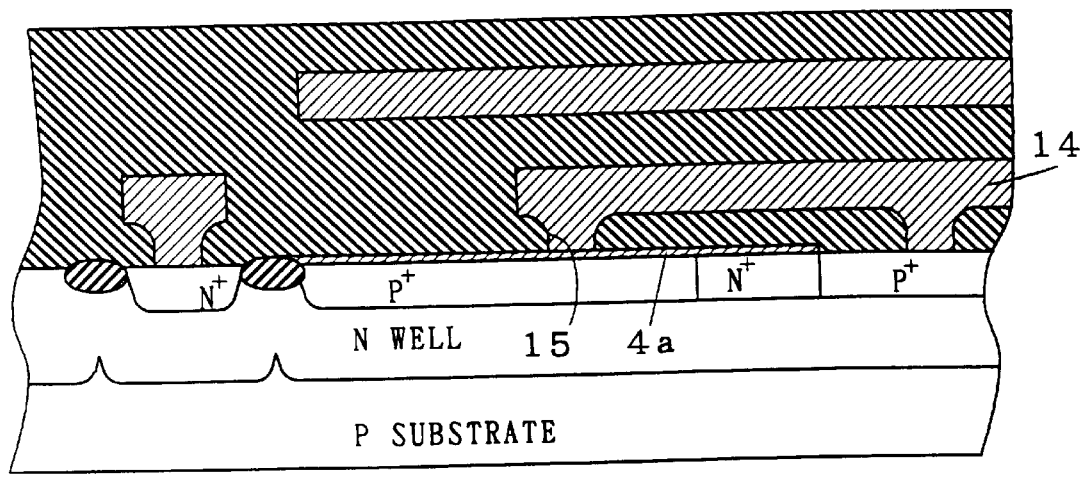
FIG. 5 is a cross section of a virtual semiconductor integrated circuit device which would be obtained by combination of prior arts.
Figure 5:
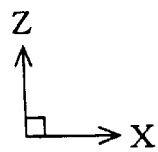

Then, this prior art can not be applied to a semiconductor integrated circuit device because it lacks a basic feature. An N well-source structure of the Full CMOS SRAM to which the prior art would be applied is shown in a cross section of FIG. 5 (along the line A–A' of FIG. 1). In a case of FIG. 5, it is surely possible to ease the positioning accuracy of the contact hole, but it is still needed to establish a contact using the contact hole. That can not overcome the problem and attain the object of the present invention.

The First Variation.

FIGS. 1 to 4 show a case where the P⁺-type diffusion region 7 and the N⁺-type diffusion region 8 are so formed as to he adjacent to each other. However, the diffusion regions 7 and 8 may be so formed as not to be adjacent to each other on the surface of and the inside of the N well 12 (the metal silicide film 4 must be formed on the surfaces of the diffusion regions 7 and (8). This structure also produces the same function and effect as above.

The Second Variation.

FIGS. 1 to 4 show a case where the third portion in which the $P^+$-type diffusion region 7 is formed is located between the first and second portions in which the $N^+$-type diffusion regions 6 and 8 are formed, respectively. Instead the second portion and the third portion may be exchanged in position. In this case. the $N^+$-type diffusion region 8 is opposed to the $N^+$-type diffusion region 6 with the insulation film 11 interposed therebetween, not ensuring the relation (the potential at the N well)>(the potential at the $P^+$-type diffusion region). As the result, the withstand latch-up voltage can not be improved, but advantageously, reduction in layout size can be still attained.

The Third Variation.

FIGS. 1 to 4 show a structure for power supply interconnection. Instead, the above technical concept may be applied to a P well-source structure for ground interconnection. For that, the power supply potential $V_{DD}$ of FIGS. 1 to 4 is replaced by the ground potential GND, and at the same time, the P-type substrate 13. the N well 12, the $N^+$-type diffusion region 6 in the first portion, the $P^+$-type diffusion region 7 in the third portion and the $N^+$-type diffusion region 8 in the second portion are replaced by an N-type substrate, a P-type well, a $P^+$-type diffusion region in the first portion, an $N^+$-type diffusion region in the third portion and a $P^+$-type diffusion region in the second portion. Further, the conductivity types are inverted in other MOS transistors respectively. In this case, the same function and effect as above can be attained.

Method of Manufacturing The First Preferred Embodiment.

A method of manufacturing the static memory cell 1 with Full CMOS structure as described with reference to FIGS. 1 to 4 will be discussed on the basis of cross sections along the line of A–A' of FIG. 1.

Figure 6:
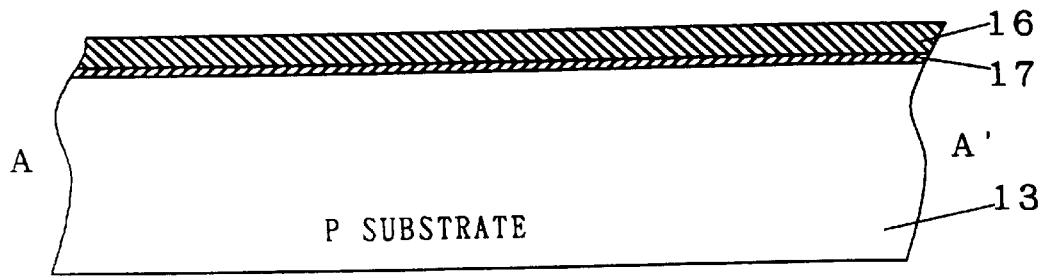

First, as shown in FIG. 6, an $SiO_2$ film 17 is formed on a surface (main surface) of the P-type substrate 13 as an underlying layer, and then an SiN film 16 is further formed thereon.

Figure 7:
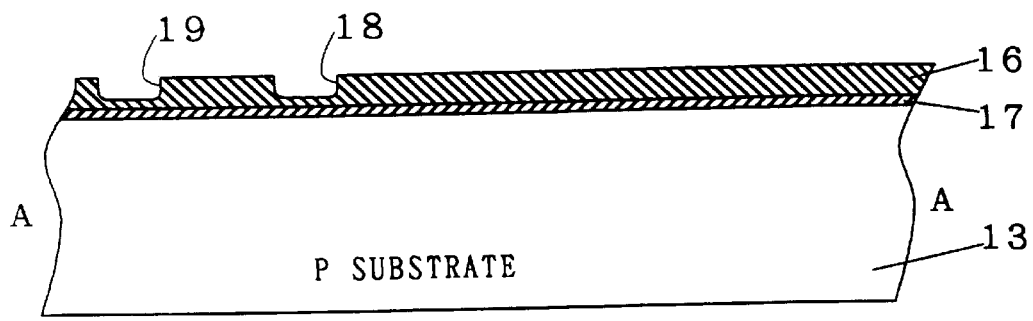

After the process step of FIG. 6, as shown in FIG. 7, the SiN film 16 is etched using photolithography and etching, and thereafter a resist not shown is removed to form regions 18 and 19 so that the $SiO_2$ film 17 may be exposed.

After the process step of FIG. 7, as shown in FIG. 8. a field oxide film is formed by selective thermal oxidation of the surface of the Si substrate 13 using the SiN film 16 as a mask, and after that the SiN film 16 and the $SiO_2$ film 17 are removed to form the insulation film 11.

After the process step of FIG. 8, as shown in FIG. 9, the $SiO_2$ film 17 is formed by thermal oxidation of Si substrate 13 and a resist pattern not shown is formed by photolithography. Ion-implantation using phosphorus P as all impurity is performed to form the N well 12 on the surface of and the inside of the P-type substrate 13 and the resist and the $SiO_2$ film 17 are thereafter removed.

After the process step of FIG. 9, as shown in FIG. 10, a predetermined pattern is formed on a resist 20 by photolithography, and ion-implantation using arsenic (AS) as an impurity is performed to form the $N^+$-type diffusion regions 6 and 8 in the first and second portions, respectively, of the N well 12. After that, unnecessary resist 20 is removed.

Figure 11:
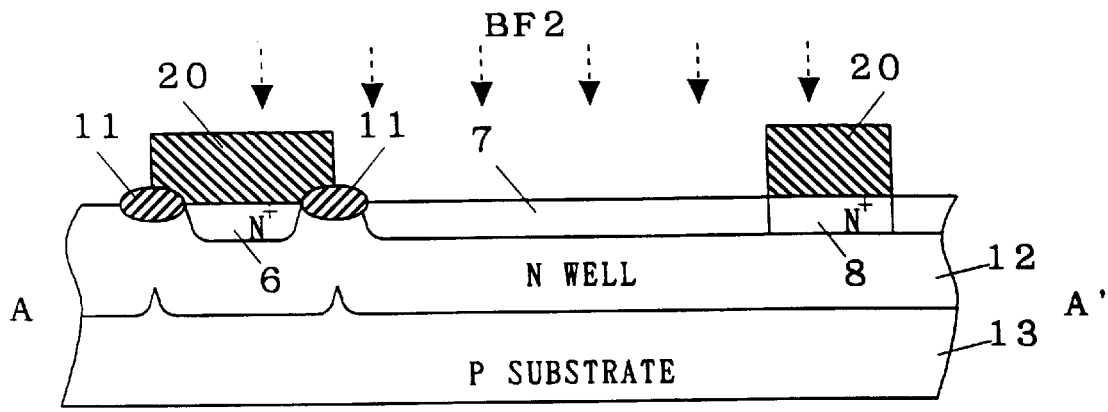

After the process step of FIG. 10, as shown in FIG. 11, a predetermined opening pattern is formed on the resist 20 by photolithography and ion-implantation using arsenic fluoride BF2 as an impurity is performed to form the $P^+$-type diffusion region 7 in the third portion of the N well 12. After that, unnecessary resist 20 is removed.

Figure 12:
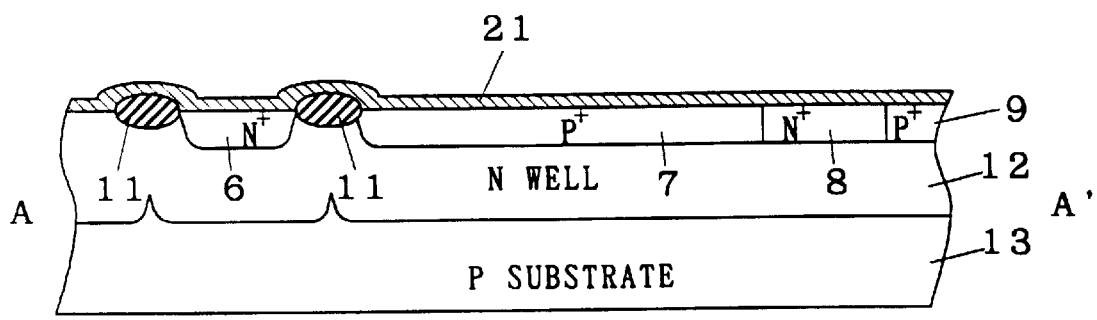

After the process step of FIG. 11. as shown in FIG. 12, a Ti film 21 is formed on the surfaces of all the diffusion regions 6 to 9 and the insulation film 11 (the Ti film 21 is also formed on the P well 28 shown in FIG. 4).

Figure 13:
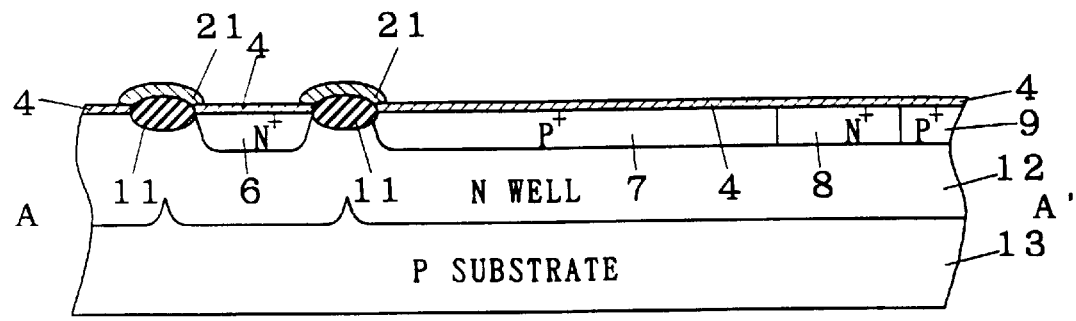

After the process step of FIG. 12, as shown in FIG. 13, a titanium suicide film (metal silicide film) 4 is formed by thermal treatment on the surfaces of the diffusion regions 6 to 9 inside the Ti film 21 with a predetermined thickness.

Figure 14:
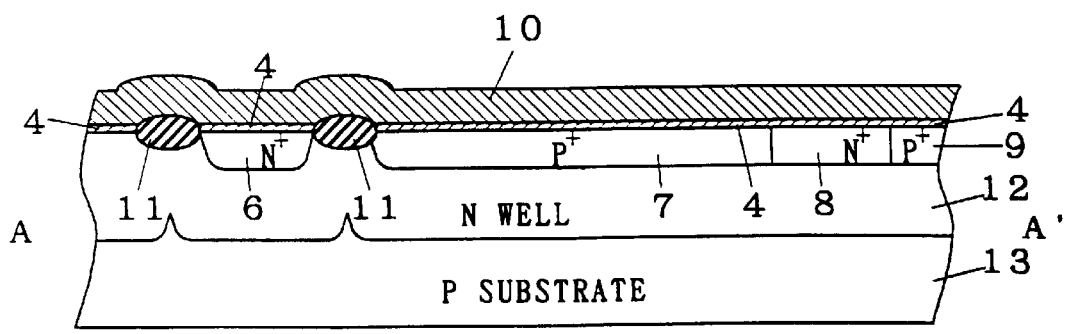

After the process step of FIG. 13, as shown in FIG. 14, only the Ti film 21 not silicide on the insulation film 11 is removed and thereafter the $SiO_2$ film 10 as an insulation film is formed so as to entirely and directly cover the surface of the titanium silicide film 4. The titanium silicide film 4 and the $SiO_2$ film 10 are thereby laminated in this order on the surfaces of the diffusion regions 6 to 9.

Figure 15:
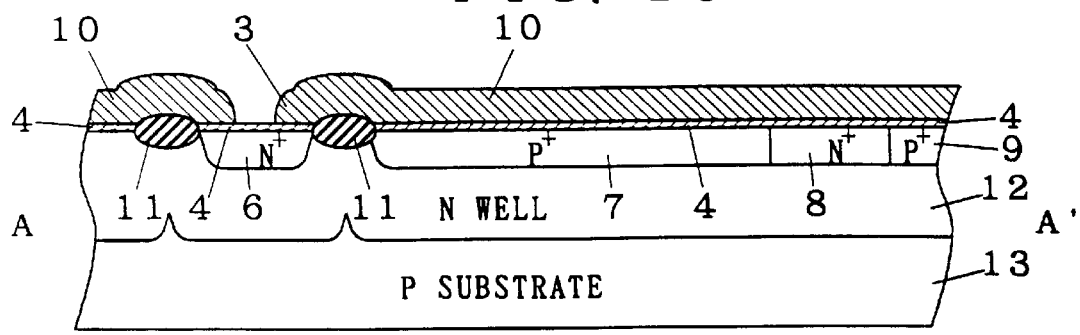

After the process step of FIG. 14, as shown in FIG. 15, the $SiO_2$ film 17 is etched by photolithograpy and etching to form the contact hole 3, and thereafter unnecessary resist not shown is removed.

Figure 16:
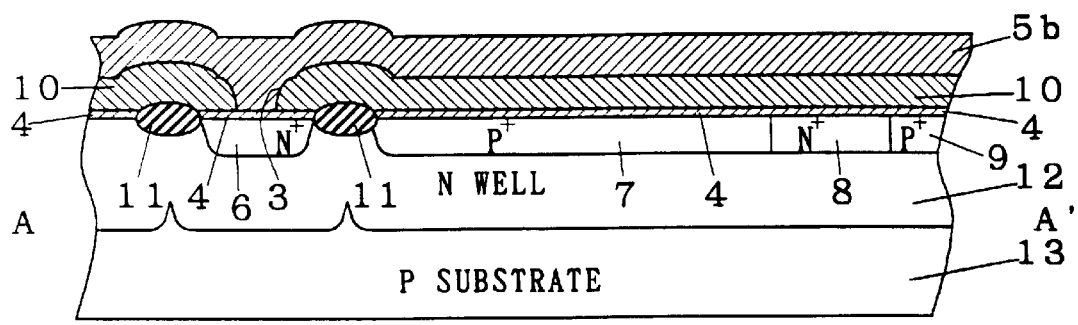

After the process step of FIG. 15, as shown in FIG. 16, a metal film 5b is formed on the surface of the $SiO_2$ film 17 and inside the contact hole 3.

Figure 17:
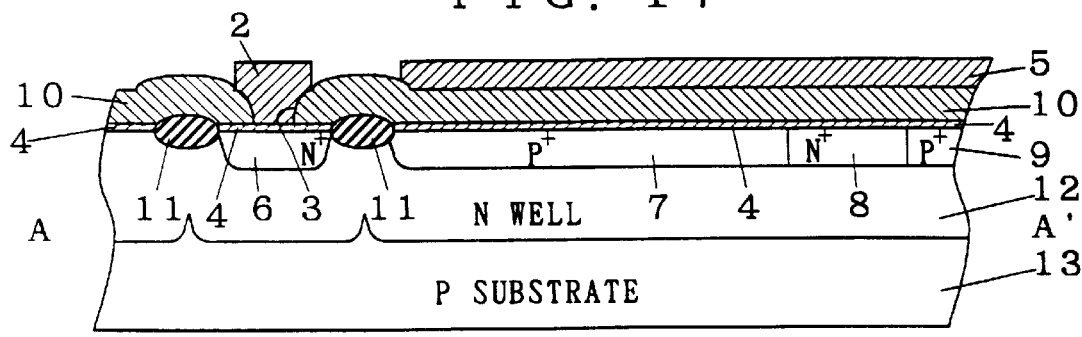

After the process step of FIG. 16, as shown in FIG. 17, a resist with a predetermined opening pattern is formed by photolithograpy and the metal film 5b is etched to form the metal wiring layer 2 and the GND wiring layer 5 which fill the contact hole 3. After that, the resist is removed. The $SiO_2$ film is formed so as to cover exposed surfaces of the films 10, 2 and 5, thus obtaining the insulation film 10 shown in FIG. 3.

Thus, in the manufacturing steps of FIGS. 12 to 17, since the conductive titanium silicide film 4 can he formed directly on the surfaces of the $P^+$-type diffusion region 7 and the $N^+$-type diffusion region 8 the titanium silicile film (conductor film) 4 electrically and directly connects the $P^+$-type diffusion region 7 and the $N^+$-type diffusion region 8. Moreover, the manufacturing process shown in FIGS. 12 to 17 does not need the step of forming the contact holes 15P. 22 and 23 and the metal wiring layer 14P inside the contact holes 15P, 22 and 23. which is essential to the prior art disclosed in the Japanese Patent Publication 1-44023, thus being simplified.

The manufacturing process steps of FIGS. 12 to 17 have an important and desirable effect on the preceding steps shown in FIGS. 9 to 11. Specifically discussing, in the manufacturing process steps of FIGS. 9 to 11, the $P^+$-type diffusion region 7 and the $N^+$-type diffusion region 8 can be formed without any consideration of formation of the contact holes 15P, 22 and 23 disclosed in the Japanese Patent Publication 1-44023 (see FIG. 19). Accordingly, it is possible to determine the sizes of the $P^+$-type diffusion region 7 and the $N^+$-type diffusion region 8 without any limitation on size-reduction depending on the diameters of the contact holes 15P, 22 and 23 in the process of forming the $P^+$-type diffusion region 7 and the $N^+$-type diffusion region 8. Therefore, the manufacturing process shown in FIGS. 9 to 11 produces an effect of markedly reducing the layout size of the $P^+$-type diffusion region 7 and the $N^+$-type diffusion region 8 as compared with the prior art disclosed in the Japanese Patent Publication 1-44023.

The manufacturing process as above can be applied to the Full CMOS SRAM memory cell array with P well-source structure through inverting the conductivity types.

The above discussion has been made on the static random access memory cell array. The present invention can he also applied to a case where an individual SRAM is formed with a functional unit of other semiconductor integrated circuit device on the same substrate.

<Conclusion>

Thus, according to the present invention, the diffusion regions 7 and 8 of different conductivity types are electrically connected with the metal silicide film 4 and the insulation film 10 entirely covers the metal suicide film 4, and therefore no contact for electrically connecting the diffusion regions 7 and 8 is needed and the layout size of the diffusion regions 7 and 8 can he markedly reduced. Moreover, with the well-source structure, the semiconductor integrated circuit device can effectively prevent the latch-up.

While the invention has been shown and described in details the foregoing description is in all aspects illustrative and not restrictive. It is therefore understood that numerous modifications and variations can be devised without departing from the scope of the invention.

We claim:

1. A semiconductor integrated circuit device having a static memory cell with CMOS structure, comprising:

a substrate of a first conductivity type;

a well of a second conductivity type provided extending inwardly from a surface of said substrate and electrically isolated from said substrate;

a first diffusion region of said second conductivity type provided in a first portion on a surface of and an inside of said well and externally given a predetermined potential;

a second diffusion region of said second conductivity type provided in a second portion on said surface of and said inside of said well;

a third diffusion region of said first conductivity type provided in a third portion on said surface of and said inside of said well so as to be electrically isolated from said well and said first and second diffusion regions;

a metal-semiconductor compound film provided on surfaces of said second and third diffusion regions, for electrically connecting said second and third diffusion regions; and an insulation film provided entirely on a surface of said metal-semiconductor compound film.

2. The semiconductor integrated circuit device of claim 1, wherein said second portion and said third portion are provided adjacent to each other.

3. The semiconductor integrated circuit device of claim 2, wherein said third portion is provided between said first and second portions.

4. The semiconductor integrated circuit device of claim 1, wherein said third portion is provided between said first and second portions.

5. The semiconductor integrated circuit device of claim 1, wherein said predetermined potential is a power supply potential, and said first conductivity type and said second conductivity type are P type and N type, respectively.

6. The semiconductor integrated circuit device of claim 1, wherein said predetermined potential is a ground potential, and said first conductivity type and said second conductivity type are N type and P type, respectively.

7. The semiconductor integrated circuit device of claim 1, wherein said metal-semiconductor compound film is made of silicide.

8. A semiconductor integrated circuit device having a static memory cell with CMOS structure, comprising:

an underlying layer of a first conductivity type;

a well of a second conductivity type provided on a surface of and an inside of said underlying layer, electrically isolated from said underlying layer and given a predetermined potential;

a first diffusion region of said first conductivity type provided on a surface of and an inside of said well;

a second diffusion region of said second conductivity type provided on said surface of and said inside of said well;

a conductor film covering surfaces of said first and second diffusion regions and electrically connecting said first and second diffusion regions; and an insulation film covering entirely on a surface of said conductor film.

* * * * *